(12) United States Patent
Hänsel et al.

(10) Patent No.: US 11,881,706 B2
(45) Date of Patent: Jan. 23, 2024

(54) SWITCHING DEVICE FOR OPENING A CURRENT PATH (71) Applicant: Siemens Energy Global GmbH & Co. KG, Bayern (DE)

(72) Inventors: Stefan Hänsel, Erlangen (DE); Karsten Handt, Berg (DE)

(73) Assignee: Siemens Energy Global GmbH & Co. KG, Bayern (DE)

( * ) Notice: Subject to any disclaimer, the term of this patent is extended or adjusted under 35 U.S.C. 154(b) by 342 days.

(21) Appl. No.: 17/426,999

(22) PCT Filed: Dec. 19, 2019

(86) PCT No.: PCT/EP2019/086185
§ 371 (c)(1),
(2) Date: Jul. 29, 2021

(87) PCT Pub. No.: WO2020/160830
PCT Pub. Date: Aug. 13, 2020

(65) Prior Publication Data
US 2022/0149613 A1    May 12, 2022

(30) Foreign Application Priority Data

Feb. 5, 2019   (EP) .................................... 19155486

(51) Int. Cl.
*H02H 7/125*    (2006.01)
*H02M 1/08*     (2006.01)
(Continued)

(52) U.S. Cl.
CPC ............ *H02H 7/1257* (2013.01); *H02M 1/08* (2013.01); *H02M 7/219* (2013.01); *H02M 7/25* (2013.01);
(Continued)

(58) Field of Classification Search
CPC .......... H02M 1/08; H02M 1/32; H02M 1/322; H02M 1/325; H02M 1/34; H02M 1/342;
(Continued)

(56) References Cited

U.S. PATENT DOCUMENTS 4,700,083 A    10/1987  Raets
5,517,378 A *   5/1996  Asplund .............. H01H 33/596
                                                      361/4

(Continued)

FOREIGN PATENT DOCUMENTS

CN    101971474 A    2/2011
CN    104160464 A    11/2014
(Continued)

OTHER PUBLICATIONS

Wang, Li, et al. "A medium-voltage medium-frequency isolated DC-DC converter based on 15-kV SiC MOSFETs." IEEE Journal of Emerging and Selected Topics in Power Electronics 5.1 (2016): 100-109.
(Continued)

*Primary Examiner* — Scott Bauer
*Assistant Examiner* — Shahzeb K Ahmad
(74) *Attorney, Agent, or Firm* — Wolter Van Dyke Davis, PLLC (57) ABSTRACT

A switching device for opening a current path of a direct-voltage network, which current path has source-side and load-side inductors, the switching device includes at least two switching modules, which are connected in series, each of the switching modules having at least one controllable semiconductor switching element, in parallel with which a series circuit of a resistor and a capacitor is connected. During operation of the switching device in order to open the current path, the controllable semiconductor switching element of at least one of the switching modules is switched
(Continued)

into a conductive state with a duty cycle until the energy stored in the inductors has been dissipated, the duty cycle being dependent on the difference between the actual voltage and a target voltage across the semiconductor switching element, the target voltage being calculated at least from the system voltage of the direct-voltage network and the number of switching modules.

19 Claims, 3 Drawing Sheets

(51) Int. Cl.
    *H02M 7/219*     (2006.01)
    *H02M 7/25*     (2006.01)
    *H03K 17/16*     (2006.01)
    *H03K 17/10*     (2006.01)

(52) U.S. Cl.
    CPC ......... *H03K 17/102* (2013.01); *H03K 17/166* (2013.01)

(58) Field of Classification Search
    CPC ....... H02M 1/344; H02H 7/12; H02H 7/1213; H02H 7/1257; H02H 7/20; H02H 7/22; H02H 7/222; H02H 9/00; H02H 9/008; H02H 9/04; H02H 9/041; H02H 9/046; H03K 17/042; H03K 17/04213; H03K 17/08128; H03K 17/0814; H03K 17/082; H03K 17/0822; H03K 17/0826; H03K 17/10; H03K 17/102; H03K 17/16
    See application file for complete search history.

(56) References Cited

U.S. PATENT DOCUMENTS

| | | | | |
|---|---|---|---|---|
| 9,692,226 | B2* | 6/2017 | Davidson | ............... H02H 3/087 |
| 9,948,089 | B2* | 4/2018 | Horinouchi | ............ H01H 9/547 |
| 2005/0276020 | A1 | 12/2005 | Ahmad | |
| 2006/0119333 | A1 | 6/2006 | Nakamura | |
| 2009/0001726 | A1 | 1/2009 | Warfen | |
| 2010/0301824 | A1 | 12/2010 | Yamamoto | |
| 2011/0032652 | A1 | 2/2011 | Shimada | |
| 2013/0009491 | A1* | 1/2013 | Hafner | ................. H03K 17/785 307/113 |
| 2014/0015592 | A1 | 1/2014 | Weis | |
| 2015/0002977 | A1* | 1/2015 | Dupraz | .................. H01H 71/10 361/115 |
| 2015/0229121 | A1* | 8/2015 | Davidson | ............... H02H 9/043 361/54 |
| 2017/0098931 | A1 | 4/2017 | Gerdinand | |
| 2017/0346384 | A1* | 11/2017 | Davidson | ................ H02M 5/45 |
| 2019/0057825 | A1 | 2/2019 | Rupp | |
| 2019/0074149 | A1 | 3/2019 | Rupp | |
| 2020/0177087 | A1* | 6/2020 | Warnes | ............. H02M 3/33553 |
| 2021/0135664 | A1 | 5/2021 | Rupp | |

FOREIGN PATENT DOCUMENTS

| | | |
|---|---|---|
| CN | 106663557 A | 5/2017 |
| CN | 107005146 A | 8/2017 |
| CN | 108701556 A | 10/2018 |
| CN | 108781075 A | 11/2018 |
| DE | 10350361 A1 | 6/2005 |
| DE | 102006009127 A1 | 9/2007 |
| EP | 1630937 A1 | 3/2006 |
| EP | 3367567 A1 | 8/2018 |
| JP | 2007097261 A | 4/2007 |
| WO | 2013127462 A1 | 9/2013 |

OTHER PUBLICATIONS

Xu, Yao; "Research on Driving Techniques of SiC MOSFET in High-Speed Switching Application"; Master's Thesis; Xidian University; 2018; English abstract on p. 7.

PCT International Search Report and Written Opinion of International Searching Authority dated Mar. 5, 2020 corresponding to PCT International Application No. PCT/E P201 9/086185 filed Dec. 19, 2019.

* cited by examiner

SWITCHING DEVICE FOR OPENING A CURRENT PATH

CROSS REFERENCE TO RELATED APPLICATIONS

This application is the US National Stage of International Application No. PCT/EP2019/086185 filed 19 Dec. 2019, and claims the benefit thereof. The International Application claims the benefit of European Application No. EP19155486 filed 5 Feb. 2019. All of the applications are incorporated by reference herein in their entirety.

FIELD OF INVENTION

The invention relates to a switching apparatus for disconnecting a current path of a DC voltage network, which current path comprises source-side and load-side inductances.

BACKGROUND OF INVENTION

A switching apparatus which is provided for the purpose of disconnecting a DC path having source-side and load-side inductances must be able to handle the feedback or reduction of energy from the DC voltage network. During rapid switching-off, high voltages build up and must be reduced via protective circuitry in order to prevent damage to the components of the switching apparatus.

Figure 4:
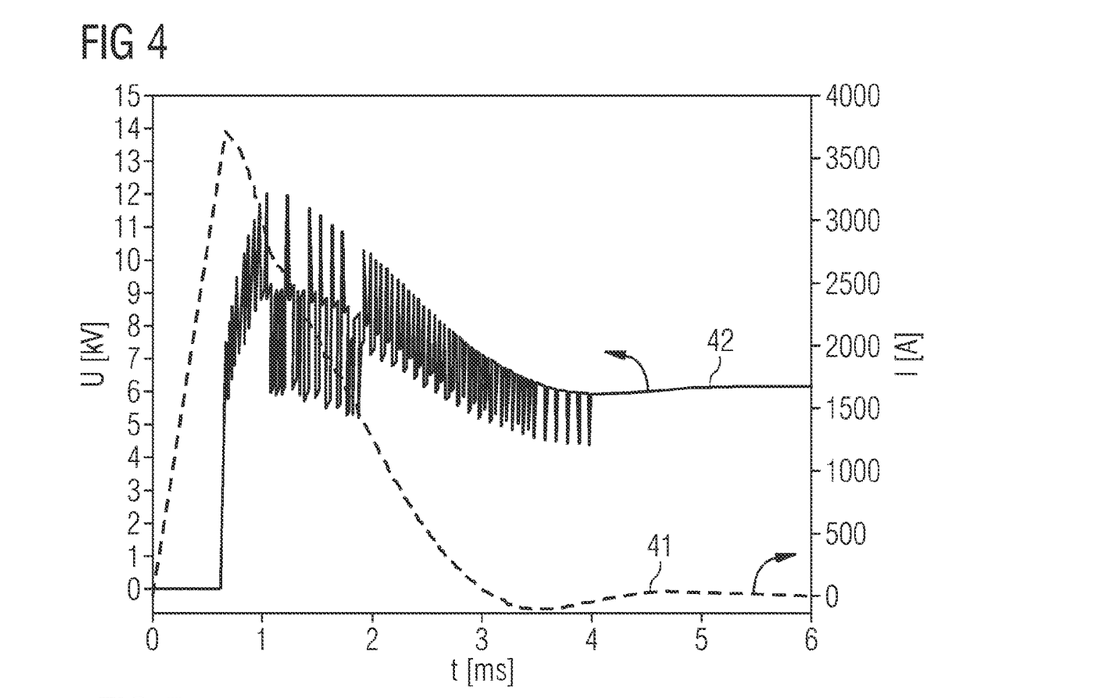
FIG. 4 shows a graph showing the temporal profile of the voltage and current during a disconnection process of the switching apparatus according to the invention with eight switching modules.

EP 3 367 567 A1 discloses a switching apparatus. The disadvantage of this circuit is an oscillating current flow, that is to say an oscillation, after a switching-off process, as can be seen in FIG. 4 therein. This oscillation has time constants in the range of 10-50 milliseconds, that is to say lasts for a comparatively long time.

SUMMARY OF INVENTION

The object of the invention is to specify an improved switching apparatus for disconnecting a current path of a DC voltage network, which current path comprises source-side and load-side inductances, which switching apparatus is structurally and/or functionally improved. In particular, the switching apparatus is intended to avoid oscillating currents after a switching-off process.

This object is achieved by means of a switching apparatus having the features of the independent claim. Advantageous configurations emerge from the dependent claims.

The switching apparatus according to the invention for disconnecting a current path of a DC voltage network, which current path comprises source-side and load-side inductances, comprises at least two switching modules connected in series. Each of the switching modules comprises at least one controllable semiconductor switching element with which a series circuit comprising a resistor and a capacitor is connected in parallel. The switching apparatus is designed in such a manner that, for the purpose of disconnecting the current path, in order to reduce the energy stored in the inductances, the controllable semiconductor switching element of at least one of the switching modules is turned on with a duty factor. In this case, the duty factor is formed using the difference between the actual voltage across the semiconductor switching element and a setpoint voltage across the semiconductor switching element, and the setpoint voltage is formed at least from the system voltage of the DC voltage network and the number of switching modules.

Such a switching apparatus enables a "soft" switching-off process in which the current flow in the current path is not reduced abruptly, but rather in a ramped manner. A counter-voltage in the current path is built up by at least one of the at least two switching modules. This is enabled by operating the respective semiconductor switch element of the switching modules with a duty factor. The high power loss in the event of switching-off is therefore not converted in the semiconductor switching element of the respective switching modules, but rather predominantly in the resistor of the respective switching modules. As a result, the switching apparatus can dispense with voltage-limiting components, such as varistors, which are expensive, heavy and take up a lot of installation space. In this case, the semiconductor switching element in the respective switching modules assumes the role of the brake chopper. At the same time, the respective capacitor of the switching modules can have small dimensions since it need not receive the entire energy stored in the source-side and load-side inductances, but rather only a small portion on account of the clocked operation of the semiconductor switching element of the relevant switching modules. The total energy to be reduced is therefore not limited by the semiconductor switching element of the relevant switching modules. The switching-off process only lasts for longer in the case of larger source-side and load-side inductances.

In this case, operation with a duty factor denotes a change between the switched-on and switched-off state of the semiconductor switch element with a predefined frequency, that is to say period duration. Within a period, the semiconductor switch element is sometimes switched on, that is to say turned on, and sometimes switched off, that is to say turned off. The duty factor indicates the proportion of the period duration for which the semiconductor switch element is switched on. During the time in which the controllable semiconductor switching element of the relevant switching module is turned off, the current in this switching module can continue to flow only via the parallel path of the RC element. The capacitor of the RC element is charged as a result.

The particular advantage of operation with a duty factor which depends on the difference between the actual voltage and the setpoint voltage is a deceleration of the energy reduction toward the end of a switching-off process. This avoids a zero crossing of the current being reached as quickly as possible. As a result, oscillations after the switching-off process are almost completely prevented. In other methods, as a result of the source-side and load-side inductances, the entire capacitor voltage across the switching apparatus at the first current zero crossing is higher than the system voltage of the DC voltage network. As a result, the current zero crossing is followed by a return current flow and a subsequent oscillation process, the duration of which may correspond to ten times the duration of the switching-off process. In contrast, the switching-off process is delayed only by 25%, for example, as a result of operation with a duty factor.

The switching apparatus can be advantageously used, in particular, in ships, in particular in medium-voltage DC networks there. A fast and safe DC switch makes it possible there to safely isolate DC zones, for example in the case of flooding or other switching-off scenarios. This generally also applies when operating other island networks in which different zones must be able to be safely and quickly isolated.

Advantageous configurations of the switching apparatus according to the invention emerge from the dependent claims. In this case, the embodiment according to the independent claims may be combined with the features of one of the subclaims or preferably also with those from a plurality of subclaims. Accordingly, the following features may also be additionally provided:

All switching modules are expediently operated with a duty factor. Since the duty factor is dependent on the actual voltage across the semiconductor switching element, which corresponds to the voltage across the series comprising the resistor and the capacitor in the same switching module, each switching module has its own temporarily variable duty factor. At most times, this will be different from those of the other switching modules. In other words, all semiconductor switch elements of the switching modules switch at a predefined frequency which is expediently selected to be the same for all switching modules. However, the period of time within a switching period, for which a semiconductor switch element is switched on, is determined separately for each switching module.

The switching apparatus expediently comprises a control apparatus for controlling the semiconductor switch elements of the switching modules. The control apparatus is configured to determine an actual voltage for each of the switching modules. The setpoint voltage is expediently stored in the control apparatus or may also be determined by means of measurement in an alternative configuration. The control apparatus controls the switching times of the semiconductor switch elements.

A plurality of semiconductor switching elements connected in series may be present for each switching module.

The duty factor is expediently directly proportional to the difference between the actual voltage and the setpoint voltage. It is also expedient to select, as the setpoint voltage, the system voltage of the DC voltage network divided by the number of switching modules. The control therefore strives directly for the final state after switching-off in which the system voltage of the DC voltage network is uniformly distributed among the switching modules.

It is advantageous if the duty factor is directly proportional to the difference between a maximum voltage for the controllable semiconductor switching element, that is to say the blocking capability, and the setpoint voltage. This makes it possible to adapt to the current-carrying and blocking capability of the semiconductor switching elements, that is to say the design of the switching apparatus.

It is advantageous if the duty factor is limited to an upper limit value which is selected in such a manner that the voltage across the switching apparatus during a switching-off process does not become lower than the system voltage of the DC voltage network. This prevents, in the very dynamic switching-off process, the control from producing a situation in which a current to be switched off, that is to say possibly even a short-circuit current, rises again. The upper limit value can be stipulated and stored in this case or can be dynamically determined.

The control of the semiconductor switching elements expediently comprises a proportional controller, wherein the proportional controller receives, as control inputs, at least the actual value and the setpoint value of the voltage.

It is advantageous if the switching frequency of the controllable semiconductor switching element is at least 5 kHz, in particular at least 20 kHz. The higher the switching frequency, the lower the fluctuations in the charge of the capacitors which result from outflow and inflow during a switching period. In other words, the current report is lower. As a result, the capacitors used may have a lower capacitance at a high switching frequency, which also results in a smaller size. Since the capacitors typically contribute a considerable amount to the overall size, this advantage may be considerable.

If so-called wide bandgap switches, in particular SiC switches or GaN switches, are used as controllable semiconductor switching elements and a switching frequency of at least 50 kHz, in particular at least 200 kHz, is used, the size of the capacitors can be reduced further.

During operation of the switching apparatus for the purpose of disconnecting the current path until the energy stored in the inductances has been reduced, a further expedient configuration provides for the semiconductor switching elements of different switching modules to be switched on and off at different times. In other words, the switching modules are clocked in an offset manner with respect to one another. This avoids or reduces simultaneous switching-on or switching-off of the switching modules and overlapping of the switched-on durations and minimizes the voltage fluctuations across the switching apparatus.

A further expedient configuration provides for a further controllable semiconductor switching element to be reversed-connected in series with the controllable semiconductor switching element in the path of the controllable semiconductor switching element of a respective switching module. This provides a switching module which can be operated in a bidirectional manner, such that, as a result, the switching apparatus can disconnect the current path irrespective of the prevailing current direction.

An expedient configuration according to a first variant provides for the parallel circuit comprising the at least one controllable switching element and the series circuit comprising the resistor and the capacitor to be connected between a first switching module connection and a second switching module connection of the respective switching module. A plurality of switching modules connected in series can then be connected in such a manner that a first switching module connection of a switching module is connected to the second switching module connection of a preceding switching module. The first switching module connection of a first switching module is connected to a DC voltage source via a source-side inductance, and a second switching module connection of a last switching module of the plurality of switching modules is connected to a load via a load-side inductance. Such a switching module in which at least one controllable semiconductor switching element, a resistor and a capacitor are provided manages with a minimum number of components.

A further expedient configuration according to a second variant provides for the parallel circuit comprising precisely one controllable semiconductor switching element and the series circuit comprising the resistor and the capacitor (so-called basic module) to be connected between a first rectifying connection and a second rectifying connection of a rectifier bridge of the respective switching module. The first rectifying connection is a first node of the rectifier bridge, at which cathode connections of two rectifying elements are connected to one another. The second rectifying connection is a second node of the rectifier bridge, at which anode connections of two further rectifying elements are connected to one another. If a unidirectional basic module, that is to say a switching module which comprises only a single semiconductor switching element, is provided in the rectifier bridge, the switching module can be used for both current directions. The current is reversed by the rectifier bridge which, in the simplest case, is a diode bridge.

According to this configuration, any desired number of switching modules can be connected in series. The series connection is effected in this case in such a manner that a third rectifying connection of a switching module is connected to a fourth rectifying connection of a preceding switching module. The third rectifying connection is a third mode of the rectifier bridge, at which a cathode connection of a rectifying element is connected to an anode connection of another rectifying element. In a corresponding manner, the fourth rectifying connection is a fourth node of the rectifier bridge, at which a cathode connection of a rectifying element is connected to a cathode connection of another rectifying element.

During operation of the switching apparatus for disconnecting the current path until the energy stored in the source-side and load-side inductances has been reduced, a further expedient configuration provides for the controllable semiconductor switching element of at least one switching module to be turned off at a given time. This makes it possible to prevent, for example in the case of a disconnection process on account of a load-side short circuit, the short-circuit current from being able to build up again via the switching apparatus.

The controllable semiconductor switching element is expediently a semiconductor switching element which can be switched off. In addition to the GaN or SiC switches mentioned, it is also possible to use IGBTs, MOSFETs, IGCTs or thyristors with a switching-off device (so-called turn-off circuit). The blocking capability of the controllable semiconductor switching element is advantageously at least 400 V, in particular at least 1 kV.

The described switching apparatus is provided, in particular, for use in a DC voltage network having a voltage of more than 400 V, in particular more than 1000 V. In particular, the switching apparatus can be used in high-voltage DC transmission lines. Depending on the voltage prevailing in the DC voltage network, a suitable appropriate number of switching modules of the switching apparatus must then be selected. The higher the voltage to be controlled in the DC voltage network, the greater the selected number of switching modules, assuming identical semiconductor switching elements. IGBTs or MOSFETs, in particular, can be used in DC voltage networks in the medium-voltage range. In the case of even higher voltages, thyristors with a switching-off device or IGCTs are used, in particular. A further configuration provides for the switching apparatus of the type described here to be used as a short-circuit-proof circuit breaker.

BRIEF DESCRIPTION OF THE DRAWINGS

The invention is explained in more detail below on the basis of exemplary embodiments in the drawing, in which.

DETAILED DESCRIPTION OF INVENTION

Identical elements are provided with identical reference signs in the following description.

Figure 1:
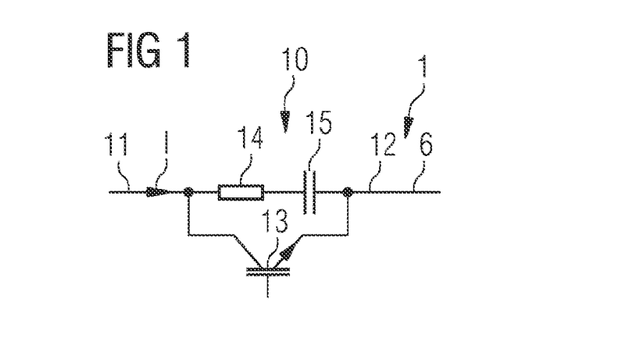
FIG. 1 shows an electrical equivalent circuit diagram showing the structure of an individual unidirectional switching module for a switching apparatus according to the invention.

FIG. 1 shows the schematic structure of a switching module 10 of a switching apparatus 1 according to the invention for disconnecting a current path 6 comprising source-side and load-side inductances. The switching module 10 comprises a controllable semiconductor switching element 13. The controllable semiconductor switching element 13 may be an IGBT or another type of semiconductor switch which can be switched off. The load connections of the controllable semiconductor switching element 13 are connected between a first switching module connection 11 and a second switching module connection 12. A series circuit comprising a resistor 14 and a capacitor 15 is also arranged between the first and second switching module connections 11, 12. In other words, an RC element formed from the resistor 14 and the capacitor 15 is connected in parallel with the load connections of the controllable switching element 13.

The basic method of operation of such an individual switching module of the switching apparatus 1 according to the invention is as follows: if the switching apparatus 1 is intended to carry current, the controllable semiconductor switching element 13 is turned on. As soon as the current path 6 is intended to be disconnected with the aid of the switching apparatus 1, the controllable semiconductor switching element 13 is turned off by means of a control apparatus not shown in the figures. As a result, the current I flowing in the current path 6 can continue to flow only via the RC element formed from the resistor 14 and the capacitor 15. The capacitor 15 is charged as a result of the current I flowing into it.

As a result, the controllable semiconductor switching element 13 is operated by the control apparatus with a duty factor, that is to say is regularly turned on and turned off again. A defined switching frequency, for example 10 kHz, is used for this purpose. This results in a period duration of 100 μs. Within this period duration, the controllable semiconductor switching element 13 is sometimes switched on, that is to say turned on, and is sometimes switched off again, that is to say turned off. The duty factor stipulates the portion of the period duration for which the controllable semiconductor switching element 13 remains turned on. A duty factor of 0 represents a complete off-state circuit, whereas a duty factor of 30% means that the controllable semiconductor switching element 13 is turned on for 30 µs within each period duration of 100 µs. It is advantageous if a frequency which is as high as possible, for example 25 kHz, is used as the switching frequency. As a result of the resulting period duration which is as short as possible and the associated faster change from the on state and the off state, the resulting charging and discharging, that is to say the voltage ripple, becomes lower and the capacitors can be designed for lower voltages. This makes it possible to save installation space for the circuit.

In order to stipulate the instantaneous duty factor for one of the switching modules 10, the actual voltage across the switching module 10 is first of all determined. This actual voltage can be measured or computationally determined. A measurement of the current, which must be carried out anyway for the purpose of detecting short circuits for example, is expedient. The voltage of the switching module can be calculated from the current and the duty factor of each switching module, that is to say the switched-on duration. The controller now attempts to control this voltage to the system voltage divided by the number of switches connected in series. Different controller approaches can be used for this purpose.

An exemplary possibility is a proportional controller (P controller). A proportional integral controller (PI controller) can also be used. The duty factor of each of the switch modules 10 is composed as follows:

$$a_i = \left(U_i - \frac{U_S}{N}\right) \cdot k_p$$

The duty factor (0 to 100%) therefore corresponds to the measured or calculated switch voltage $U_i$ for the ith semiconductor switching element 13 in the ith switching module 10 minus the system voltage $U_S$ divided by the number of switching modules N, multiplied by the controller constant $k_p$. The term $U_S/N$ can be considered to be the setpoint voltage across each of the switching modules 10 in the switched-off state. The controller constant $k_p$ can be calculated as follows in this case:

$$k_p = \left(U_{max} - \frac{U_S}{N}\right) \cdot a_{max}$$

In this case, $U_{max}$ corresponds to the switch voltage which can occur at most across a semiconductor switching element 13 and $a_{max}$ corresponds to the maximum duty factor for which the system is designed. In this case, the maximum duty factor constitutes a design parameter for the semiconductor switching element 13. The greater this value, the higher the currents and the lower the voltages the system is designed for; the lower the value, the higher the voltages and the lower the currents.

With this type of control, the short-circuit current constitutes a disturbance variable. The energy flowing out of the capacitors when the switch is closed is also not considered in this control and constitutes a disturbance variable. With this design, the situation may occur in which the duty factor is selected to be so large that the voltage built up across the entire switch becomes lower on average than the system voltage and the current would continue to rise. However, this should be prevented. For this reason, it is expedient to allow the proportional controller to also be followed by a limiting element. This limits the maximum duty factor in such a manner that the voltage dropped across the entire switch on temporal average does not become lower than the system voltage. In contrast, short-term undershooting of the system voltage is possible and can be seen in FIGS. 4 to 7.

Figure 2:
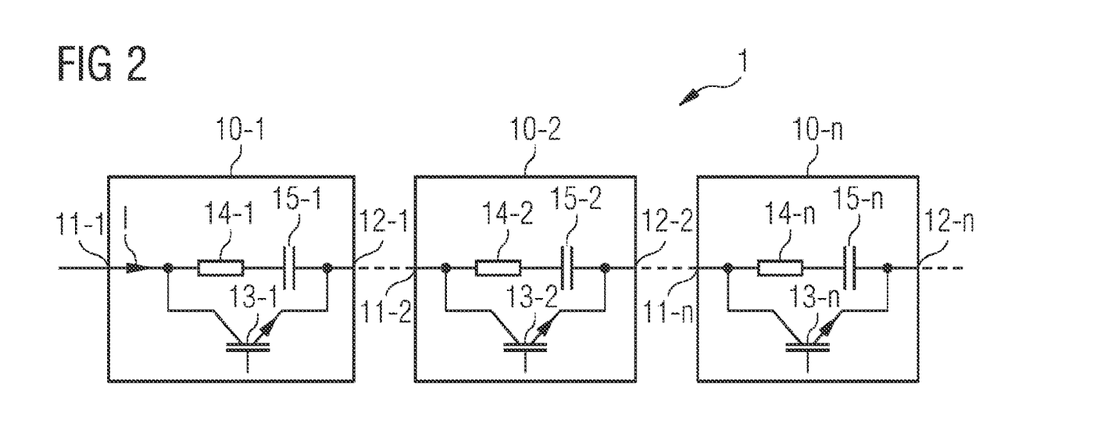
FIG. 2 shows an electrical equivalent circuit diagram of a series connection of three switching modules shown in FIG. 1.
Figure 3:
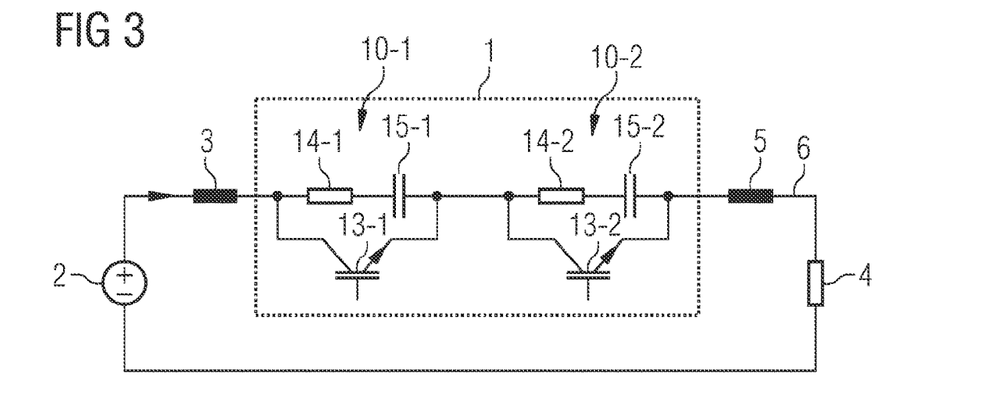
FIG. 3 shows an electrical equivalent circuit diagram of a switching apparatus according to the invention in a DC voltage network having source-side and load-side inductances.

FIG. 2 shows an electrical equivalent circuit diagram of a series connection of n switching modules 10-1, 10-2, . . . , 10-n (generally: 10-i, where i=1 to n). Each of the switching modules 10-i is constructed in the manner described in FIG. 1. In this case, the switching modules 10-i are connected in series in such a manner that the second switching module connection 12-1 of the first switching module 10-1 is connected to the first switching module connection 11-2 of the subsequent switching module 10-2, and so on. The first switching module connection 11-1 of the first switching module 10-1 is connected to a DC voltage source 2 via a source-side inductance 3, as shown in FIG. 3. The DC voltage source 2 may be, for example, an energy generating unit, for example a photovoltaic installation, a storage system, a battery charging device, a wind energy installation, a rectifier and the like. The second switching module connection 12-n of the last switching module 10-n is connected to a load 4 via a load-side inductance 5, as shown in FIG. 3. The load 4 may be, for example, a drive of a DC voltage network or the like.

FIG. 3 shows the electrical equivalent circuit diagram of a switching apparatus 1 according to the invention which is composed of two switching modules 10-1 and 10-2 which are connected in series with one another and are each constructed as described in FIG. 1. The switching apparatus 1 is connected to the DC voltage source 2 via the source-side inductance 3 which has already been mentioned. On the output side, the switching apparatus 1 is connected to the load 4 via the load-side inductance 5. The source-side and load-side inductances 3, 5 need not necessarily constitute physical components of the DC voltage network. The source-side and load-side inductances 3, 5 may also be line inductances.

The method of operation of the switching apparatus shown in FIG. 3 is as follows: if the load 4 is intended to be supplied with current from the DC voltage source 2, the controllable semiconductor switching elements 13-1, 13-2 (generally: 13-i, i=1 to 2) of the switching modules 10-1, 10-2 (generally: 10-i, i=1 to 2) are turned on. As soon as the current path 6 is intended to be disconnected, for example on account of a load-side short circuit, a change is made to operation with a duty factor, in which the controllable semiconductor switching elements 13-i change between the on state and the off state at a fixed frequency, as already described. In this case, the controllable semiconductor switching elements 13-i are expediently controlled in an offset manner, with the result that their switched-on times overlap as little as possible. Controlling the duty factor on the basis of the respective switch voltage and the setpoint voltage ensures that there is a sum voltage $U_{ges}$ across both controllable semiconductor switching elements 13-i together, which sum voltage is used to reduce the current flow and therefore the energy stored in the inductances 3, 5.

Unlike when using a single switching module, there is always a counter-voltage (that is to say a voltage directed counter to the voltage direction of the DC voltage source 2) in the DC voltage network in the case of a plurality of switching modules. If the number n of switching modules connected in series is very high, the brief short-circuiting of a switching module is of little importance, as a result of which the current is gradually reduced. The described procedure is carried out in a corresponding manner irrespective of the number n of switching modules connected in series.

FIG. 4 shows the temporal profile of the voltage 42 and of the current 41 for a switching apparatus 1 which comprises eight switching modules 10. In the graph in FIG. 4, a nominal voltage of 6 kV and a current of 2 kA are assumed. In the exemplary embodiment shown, the source-side inductance is 1 mH, whereas no load-side inductance was used for this simulation. In real environments, inductances will typically be present on both sides, in which case they are formed by discrete components or may be present in a parasitic form or both together. It can be clearly seen that the current path is disconnected at a time t≈0.6 ms. The voltage 42 which is dropped across the switching apparatus 1 before the switching-off is determined by the on-state losses of the controllable semiconductor switching element 13. As a result of the switching-off at the time t≈0.6 ms, the voltage increases to just below 10 kV. The clocked switching-off and switching-on of the controllable semiconductor switching element results in a profile remaining between 4 kV and 12 kV until the time t≈4 ms, in which case the current I is reduced by the counter-voltage within approximately 2.5 ms.

Figure 5:
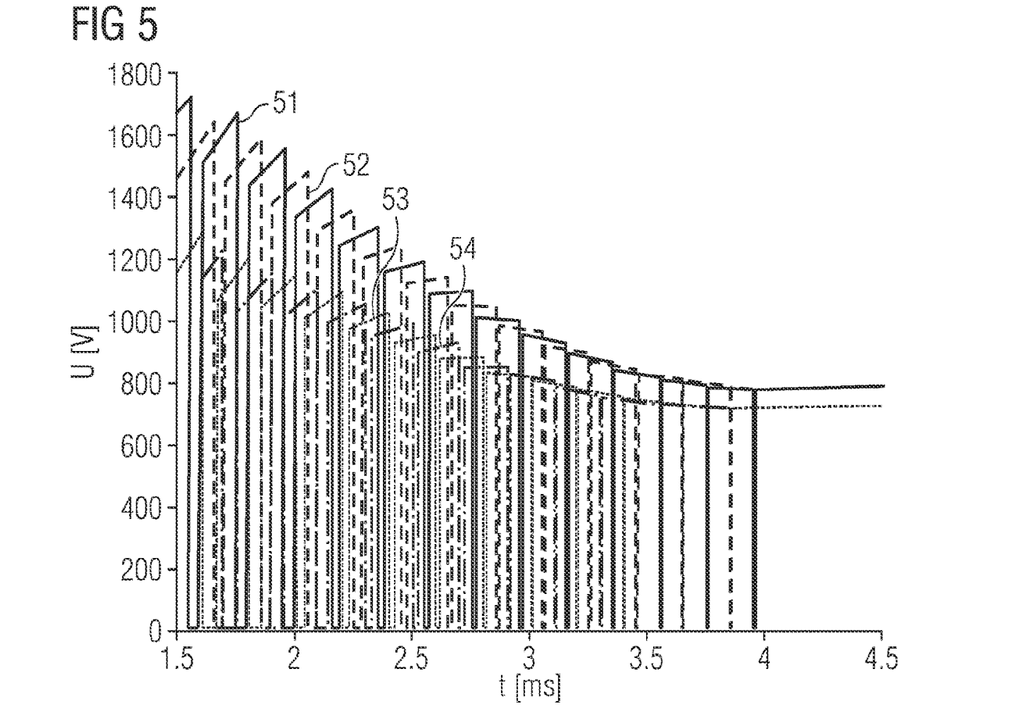
FIG. 5 shows a graph illustrating the temporal profile of the voltage dropped across eight switching modules connected in series with one another.

FIG. 5 shows a graph in which the temporal profile of the voltages in the case of a switching-off process of the switching apparatus 1 having eight switching modules connected in series is shown in a higher temporal resolution. In this case, two of the eight switching modules each switch at the same time in the simulation on which the graph in FIG. 5 is based, with the result that only four separate voltage profiles 51 . . . 54—for four pairs of switching modules 10—can be seen. The time section shown between 1.5 ms and 4.5 ms makes clear the clocking of the controllable semiconductor switching elements of the switching modules 10 at a fixed switching frequency of 5 kHz. It is also clear that the four pairs of switching modules switch with a phase shift with respect to one another and at least one controllable semiconductor switching element 13-$i$ is turned off at a given time. Initially, that is to say with a high duty factor, the switched-on periods nevertheless overlap in this case on account of their respective length, that is to say on account of the duty factor which is still high. After approximately 2 ms, the switched-on periods begin to no longer overlap. After approximately 3 ms, it can be seen that the duty factors become low and the semiconductor switching elements 13-$i$ are switched on only for short periods, but still at the same frequency.

In the graph in FIG. 5, two of the four pairs of switching modules 10 operate at a lower voltage 53, 54 than the other two pairs. This is an artifact of the simulation. Such control is possible, in principle. However, it is expedient and advantageous for the entire switch if all switching modules 10 are operated in the same manner, that is to say also operate with the same voltage load. As a result of the different voltage levels 51 . . . 54 of the switching modules 10 in FIG. 5, the result is also different duty factors, which can be seen in the region of t=3 ms. Furthermore, the switching modules 10 with the lower voltage also switch off entirely somewhat earlier, at approximately t=3.5 ms. A switching module 10 is caused to be entirely switched off if the current falls below a definable threshold value, for example 50 A, and the voltage across the switching module 10, that is to say the voltage of the capacitor 15-$i$, is close to the system voltage, that is to say the difference from the system voltage undershoots a threshold value.

As a result of the described control of the duty factor on the basis of the difference between the actual voltage and the setpoint voltage for each of the switching modules 10-$i$, the duty factor depends substantially on the currently present inductively caused overvoltage across the entire switching apparatus. If this approaches 0 V, as in FIG. 4 and FIG. 5 after a time of approximately 2.5 ms, the duty factor falls accordingly. Since, however, there is always still a short switched-on time, the capacitors 15-$i$ are always still able to be discharged. Therefore, with the absence of the overvoltage, that is to say after the energy has been reduced, there is also no longer any substantial overvoltage of the capacitors 15-$i$ which would cause a return current flow and therefore subsequent oscillation of the current. Subsequent oscillations are almost completely avoided, as can be clearly seen in FIG. 4. A comparatively weak and short return current which is nevertheless present can be seen in FIG. 5 after approximately t=3 ms from the fact that the voltage across the capacitors 15-$i$ falls when the semiconductor switching element 13-$i$ is turned off, instead of rising. After this time, the current reaches 0 A for the first time, whereas the total voltage across the switching apparatus is still somewhat higher than the nominal voltage of 6 kV.

Figure 6:
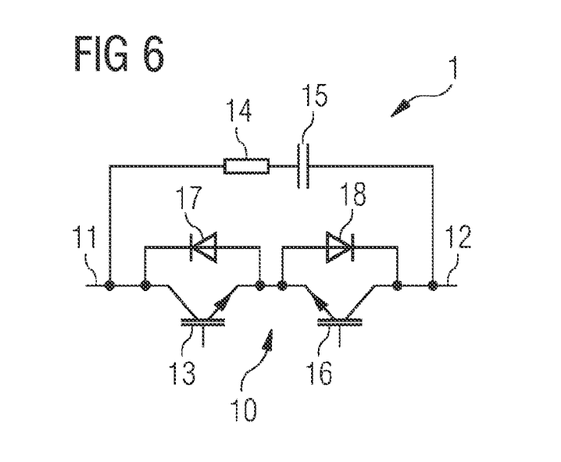
FIG. 6 shows an exemplary embodiment of a bidirectional switching module according to the invention.

FIG. 6 shows a modification of the switching module 10 shown in FIG. 1. In addition to the semiconductor switching element 13, a further semiconductor switching element 16 is reverse-connected in series with the controllable semiconductor switching element 13. The controllable semiconductor switching element 13 and the further controllable semiconductor switching element 16 may be of the same type, for example IGBTs. The behavior of this switching module 10 which can be operated in a bidirectional manner corresponds to the behavior of the switching module from FIG. 1. In the bidirectional switching module 10 shown in FIG. 6, the current flow may be directed in both directions. In this case, one of the two controllable semiconductor switching elements 13, 16 is turned on and the other is turned off in the conducting case. The current flow is ensured via a respective diode 17 or 18 reverse-connected in parallel.

Figure 7:
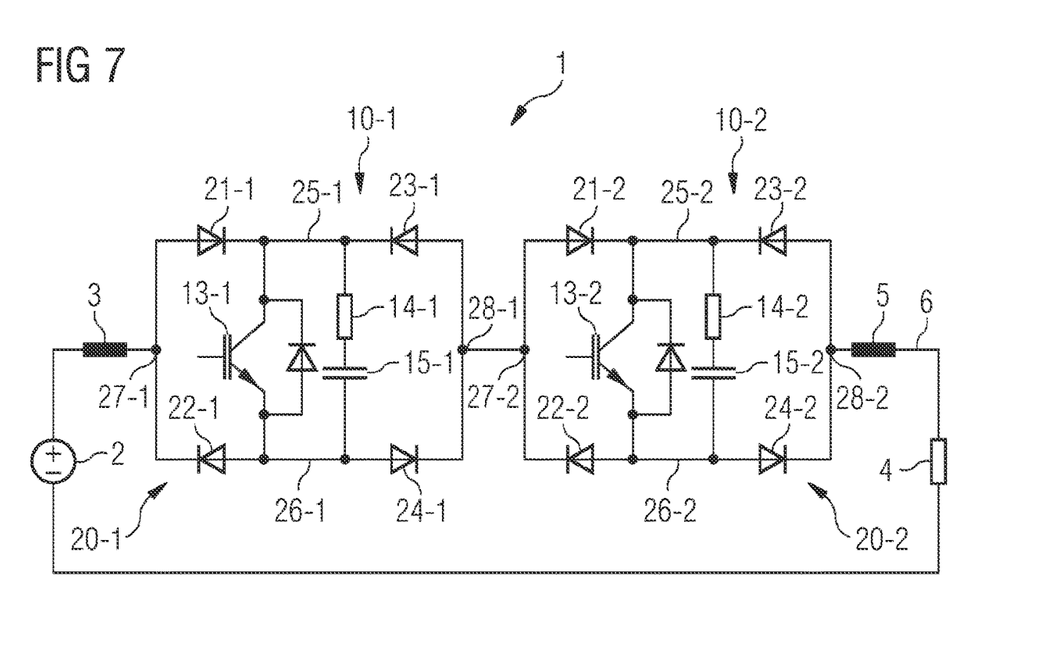
FIG. 7 shows an electrical equivalent circuit diagram of a switching apparatus according to the invention in a DC voltage network, in which the switching apparatus is composed of two modified switching modules having a bridge rectifier.

FIG. 7 shows a further electrical equivalent circuit diagram of a switching apparatus 1 according to the invention, in which case this comprises, by way of example, two switching apparatuses 10-1 and 10-2. Like in FIG. 3, these are connected between a source-side inductance 3 and a load-side inductance 5. The switching modules 10-1 and 10-2 (generally: 10-$i$, where i=1 to 2) are able to process a bidirectional current flow. For this purpose, a basic module shown in FIG. 1 is integrated in a rectifier bridge 20-1 and 20-2 (generally: 20-$i$, where i=1 to 2). The structure is described on the basis of the switching module 10-1, in which case the structure of the switching module 10-2 is identical.

The rectifier bridge 20-1 is implemented as a diode bridge having four diodes 21-1, 22-1, 23-1 and 24-1. A first rectifier connection 25-1 is formed between cathodes of the diodes 21-1 and 23-1. A second rectifier connection 26-1 is formed between anode connections of the diodes 22-1 and 24-1. The switching module constructed as in FIG. 1 is connected between the first rectifier connection 25-1 and the second rectifier connection 26-1. A third rectifier connection 27-1 is formed between the anode of the diode 21-1 and the cathode of the diode 22-1. The third rectifier connection 27-1 is connected to the DC voltage source 2 via the source-side inductance 3. A fourth rectifier connection 28-1 is formed between an anode of the diode 23-1 and a cathode of the diode 24-1. The fourth rectifier connection 28-1 is connected to the first rectifier connection 27-2 of the second switching module 10-2.

A unidirectional basic module is therefore arranged in the rectifier bridge 20-1, which together produce the switching module 10-1. This is used for both current directions, in which case the current is reversed by the elements of the rectifier bridge 20-*i*. For the sake of simplicity, only the DC voltage source 2 to the left of the switching apparatus 1 and the load 4 to the right of the switching apparatus 1 are illustrated in FIG. 7. For bidirectional operation, the arrangement has a further DC voltage source to the right of the switching apparatus 1 and a further load 4 to the left of the switching apparatus 1.

As shown in FIG. 7, any desired number of the switching modules 10-*i* can be connected in series.

LIST OF REFERENCE SIGNS

1 Switching apparatus
2 DC voltage source
3 Source-side inductance
4 Load
5 Load-side inductance
6 Current path
10, 10-*i* Switching module
11, 11-*i* Switching module connection
12, 12-*i* Switching module connection
13, 13-*i* Controllable semiconductor switching element
14, 14-*i* Resistor
15, 15-*i* Capacitor
16 Further controllable semiconductor switching element
17 Diode
18 Diode
20-*i* Rectifier bridge
20-*i* . . . 24-*i* Diode
25-*i* Rectifier connection
26-*i* Rectifier connection
27-*i*, 28-*i* Rectifier connection
41 Switch current
42 Switch voltage
51 . . . 54 Switching module voltages

The invention claimed is:

1. A switching apparatus for disconnecting a current path of a DC voltage network, which current path comprises source-side and/or load-side inductances, comprising:
at least two switching modules connected in series, wherein each of the switching modules comprises at least one controllable semiconductor switching element with which a series circuit comprising a resistor and a capacitor is connected in parallel,
wherein the switching apparatus is configured in such a manner that, during disconnection of the current path, in order to reduce energy stored in the inductances, the semiconductor switching element of at least one of the switching modules is turned on with a duty factor,
wherein the duty factor is formed using a difference between an actual voltage across the semiconductor switching element and a setpoint voltage across the semiconductor switching element, and
wherein the setpoint voltage is formed at least from the system voltage of the DC voltage network and the number of switching modules.

2. The switching apparatus as claimed in claim 1, wherein the duty factor is directly proportional to the difference between the actual voltage and the setpoint voltage.

3. The switching apparatus as claimed in claim 1, wherein the setpoint voltage is equal to the system voltage of the DC voltage network divided by the number of switching modules.

4. The switching apparatus as claimed in claim 1, wherein the switching apparatus is configured in such a manner that the duty factor is limited to an upper limit value which is selected in such a manner that the voltage across the switching apparatus during a switching-off process does not become lower on temporal average than the system voltage of the DC voltage network.

5. The switching apparatus as claimed in claim 1, further comprising:
in each case a proportional controller for controlling the controllable semiconductor switching elements,
wherein the proportional controller receives, as control inputs, at least the actual value and the setpoint value of the voltage.

6. The switching apparatus as claimed in claim 1, wherein the switching apparatus is configured in such a manner that the switching frequency of the controllable semiconductor switching element is at least 5 kHz.

7. The switching apparatus as claimed in claim 6, wherein the switching frequency of the controllable semiconductor switching element is at least 20 kHz.

8. The switching apparatus as claimed in claim 1, wherein the controllable semiconductor switching element is a wide bandgap switch, and the switching frequency is at least 50 kHz.

9. The switching apparatus as claimed in claim 8, wherein the controllable semiconductor switching element is a wide bandgap switch, comprising an SiC switch or a GaN switch.

10. The switching apparatus as claimed in claim 8, wherein the switching frequency is at least 200 kHz.

11. The switching apparatus as claimed in claim 1, wherein the parallel circuit, comprising the at least one controllable semiconductor switching element and the series circuit comprising the resistor and the capacitor, is connected between a first rectifying connection and a second rectifying connection of a rectifier bridge of the respective switching module,
wherein the first rectifying connection is a first node of the rectifier bridge, at which cathode connections of two rectifying elements are connected to one another, and
wherein the second rectifying connection is a second node of the rectifier bridge, at which anode connections of two further rectifying elements are connected to one another.

12. The switching apparatus as claimed in claim 1, wherein, during operation of the switching apparatus for disconnecting the current path until the energy stored in the inductances has been reduced, the controllable semiconductor switching element of a first portion of switching modules is turned off at a given time and a second portion of switching modules is turned on.

13. The switching apparatus as claimed in claim 1, wherein, during operation of the switching apparatus for disconnecting the current path until the energy stored in the inductances has been reduced, the semiconductor switching elements of different switching modules are switched on and off at different times.

14. The switching apparatus as claimed in claim 1, wherein a further controllable semiconductor switching element is reversed-connected in series with the controllable semiconductor switching element in the path of the controllable semiconductor switching element of a respective switching module.

15. The switching apparatus as claimed in claim 1, wherein the controllable semiconductor switching element has a blocking capability of at least 400 V.

16. The switching apparatus as claimed in claim 15, wherein the controllable semiconductor switching element has a blocking capability of at least 1000 V.

17. A DC voltage network having a system voltage of at least 400 V comprising:
a switching apparatus as claimed in claim 1.

18. The DC voltage network as claimed in claim 17, wherein the system voltage is at least 1 kV.

19. A short-circuit-proof circuit breaker, comprising:
the switching apparatus of claim 1.

* * * * *